US008664730B2

(12) United States Patent
Hashimoto

(10) Patent No.: US 8,664,730 B2
(45) Date of Patent: Mar. 4, 2014

(54) MANUFACTURING METHOD FOR ELECTRONIC COMPONENT, ELECTRONIC COMPONENT, AND ELECTRONIC EQUIPMENT

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 304 days.

(21) Appl. No.: 12/961,804

(22) Filed: Dec. 7, 2010

(65) Prior Publication Data

US 2011/0074250 A1 Mar. 31, 2011

Related U.S. Application Data

(60) Continuation of application No. 12/011,584, filed on Jan. 28, 2008, now Pat. No. 7,867,830, which is a division of application No. 11/362,591, filed on Feb. 24, 2006, now Pat. No. 7,348,263.

(30) Foreign Application Priority Data

Mar. 1, 2005 (JP) ................................ 2005-055626

(51) Int. Cl.
*H01L 41/053* (2006.01)

(52) U.S. Cl.
USPC ...................................................... 257/415

(58) Field of Classification Search
USPC ................. 257/414, 415, 417, 678, 734, 787, 257/E23.001, E23.116, E23.141; 438/50–52, 106–108, 127; 331/68
See application file for complete search history.

(56) References Cited

U.S. PATENT DOCUMENTS

| 5,500,628 | A  | * | 3/1996  | Knecht ........................... 331/68 |
| 5,585,687 | A  | * | 12/1996 | Wakabayashi et al. ....... 310/366 |
| 5,668,057 | A  |   | 9/1997  | Eda et al. |
| 5,798,557 | A  |   | 8/1998  | Salatino et al. |
| 5,841,217 | A  | * | 11/1998 | Kizaki et al. ................... 310/348 |
| 5,915,168 | A  |   | 6/1999  | Salatino et al. |
| 6,229,249 | B1 | * | 5/2001  | Hatanaka et al. ............. 310/348 |
| 6,229,404 | B1 | * | 5/2001  | Hatanaka ........................ 331/68 |
| 6,456,168 | B1 | * | 9/2002  | Luff ................................ 331/68 |
| 6,587,008 | B2 | * | 7/2003  | Hatanaka et al. ............... 331/68 |
| 6,653,906 | B1 | * | 11/2003 | Knecht .................... 331/107 DP |

(Continued)

FOREIGN PATENT DOCUMENTS

| CN | 1440590 A | 9/2003 |
| JP | 10-98121  | 4/1998 |

(Continued)

*Primary Examiner* — Michele Fan
(74) *Attorney, Agent, or Firm* — Harness, Dickey & Pierce, P.L.C.

(57) ABSTRACT

A manufacturing method for electronic device, includes: preparing a first substrate having a plurality of first regions; preparing a second substrate having a plurality of second regions; facing the first region and the second region each other, and connecting the first substrate and the second substrate while disposing at least a part of a functional element within a space between the first region and the second region; obtaining a plurality of first divisional substrates by cutting the first substrate at each of the first regions, after the connecting of the first substrate and the second substrate; forming a sealing film covering the plurality of the first divisional substrates on the second substrate, after cutting the first substrate; obtaining a plurality of second divisional substrates by cutting the second substrate at each of the second regions, after forming the sealing film; and obtaining a plurality of individual electronic devices.

13 Claims, 13 Drawing Sheets

(56) References Cited

U.S. PATENT DOCUMENTS

| | | | |
|---|---|---|---|
| 6,703,768 B2* | 3/2004 | Kageyama et al. | 310/344 |
| 6,833,654 B2* | 12/2004 | Rubach | 310/344 |
| 6,914,367 B2 | 7/2005 | Furukawa | |
| 6,917,142 B2* | 7/2005 | Koyama et al. | 310/344 |
| 7,011,986 B2 | 3/2006 | Daeche et al. | |
| 7,057,331 B2* | 6/2006 | Shimodaira et al. | 310/344 |
| 7,132,737 B2* | 11/2006 | Miyazaki | 257/678 |
| 7,211,934 B2 | 5/2007 | Fujiwara et al. | |
| 7,242,258 B2* | 7/2007 | Hatanaka et al. | 331/68 |
| 7,266,869 B2* | 9/2007 | Hatanaka et al. | 29/25.35 |
| 7,449,820 B2* | 11/2008 | Moriya | 310/348 |
| 7,486,149 B2* | 2/2009 | Harima | 331/68 |
| 7,498,722 B2* | 3/2009 | Sakai | 310/340 |
| 7,521,843 B2* | 4/2009 | Naruse | 310/344 |
| 7,551,040 B2* | 6/2009 | Harima | 331/68 |
| 7,598,763 B2* | 10/2009 | Nagamatsu | 324/764.01 |
| 7,764,138 B2* | 7/2010 | Harima et al. | 331/158 |
| 7,932,786 B2* | 4/2011 | Moriya et al. | 331/68 |
| 7,969,072 B2* | 6/2011 | Matsuzawa et al. | 310/348 |
| 8,008,980 B2* | 8/2011 | Moriya et al. | 331/68 |
| 8,253,505 B2* | 8/2012 | Ogura et al. | 331/156 |
| 8,421,543 B2* | 4/2013 | Hsu et al. | |
| 2002/0036448 A1* | 3/2002 | Kageyama et al. | 310/348 |
| 2002/0135429 A1* | 9/2002 | Akagawa et al. | 331/68 |
| 2003/0064549 A1* | 4/2003 | Saitou | 438/127 |
| 2003/0112986 A1 | 6/2003 | Furukawa | |
| 2003/0137361 A1* | 7/2003 | Knecht et al. | 331/176 |
| 2003/0197569 A1* | 10/2003 | Mizusawa | 331/158 |
| 2003/0210102 A1* | 11/2003 | Harima et al. | 331/158 |
| 2004/0016995 A1* | 1/2004 | Kuo et al. | 257/678 |
| 2004/0017004 A1* | 1/2004 | Kasai et al. | 257/704 |
| 2004/0041640 A1* | 3/2004 | Harima et al. | 331/57 |
| 2004/0056566 A1* | 3/2004 | Rubach | 310/348 |
| 2004/0095199 A1* | 5/2004 | Ono et al. | 331/158 |
| 2004/0113708 A1* | 6/2004 | Takanashi et al. | 331/158 |
| 2004/0195691 A1* | 10/2004 | Moriyasu et al. | 257/758 |
| 2004/0217673 A1* | 11/2004 | Unno et al. | 310/348 |
| 2004/0257478 A1 | 12/2004 | Su | |
| 2005/0023661 A1 | 2/2005 | Matsubara et al. | |
| 2005/0104204 A1 | 5/2005 | Kawakubo et al. | |
| 2005/0193548 A1* | 9/2005 | Nakazawa | 29/594 |
| 2006/0022762 A1* | 2/2006 | Asamura | 331/158 |
| 2006/0103003 A1 | 5/2006 | Heide et al. | |
| 2006/0170305 A1* | 8/2006 | Ohshima et al. | 310/311 |
| 2006/0180897 A1 | 8/2006 | Park et al. | |
| 2006/0197619 A1* | 9/2006 | Oishi et al. | 331/158 |
| 2006/0245308 A1* | 11/2006 | Macropoulos et al. | 369/1 |
| 2007/0108634 A1 | 5/2007 | Higashi et al. | |
| 2007/0176517 A1* | 8/2007 | Moriya et al. | 310/348 |
| 2007/0247029 A1* | 10/2007 | Maruyama | 310/348 |
| 2011/0193637 A1* | 8/2011 | Kasahara | 331/68 |
| 2012/0154061 A1* | 6/2012 | Asamura | 331/68 |

FOREIGN PATENT DOCUMENTS

| | | | |
|---|---|---|---|
| JP | 11-087406 | | 3/1999 |
| JP | 11-097584 | | 4/1999 |
| JP | 11103233 A | * | 4/1999 |
| JP | 11-150440 | | 6/1999 |
| JP | 2000-077458 | | 3/2000 |
| JP | 2000-261284 | | 9/2000 |
| JP | 2001-244785 | | 9/2001 |
| JP | 2003-092382 | | 3/2003 |
| JP | 2004-129088 | | 4/2004 |
| JP | 2004-135193 | | 4/2004 |
| JP | 2004-214469 | | 7/2004 |
| JP | 2005-109221 | | 4/2005 |
| JP | 2006-517057 | | 7/2006 |
| JP | 2007096372 A | * | 4/2007 |
| WO | WO 03/086956 | | 10/2003 |
| WO | 2005055317 | | 6/2005 |

* cited by examiner

MANUFACTURING METHOD FOR ELECTRONIC COMPONENT, ELECTRONIC COMPONENT, AND ELECTRONIC EQUIPMENT

CROSS-REFERENCE TO RELATED APPLICATIONS

This application is a continuation patent application of U.S. Ser. No. 12/011,584 filed Jan. 28, 2008 which is a divisional of U.S. Ser. No. 11/362,591 filed Feb. 24, 2006, now U.S. Pat. No. 7,348,263 issued Mar. 25, 2008, which claims priority to Japanese Patent Application No. 2005-055626, filed Mar. 1, 2005, all of which are incorporated herein by reference.

BACKGROUND

1. Technical Field

The present invention relates to a manufacturing method for electronic component, an electronic component, and an electronic equipment.

2. Related Art

In recent years, electronic components packaging functional elements such as semiconductor elements have been used in a variety of applications. In this type of electronic component, the active surface of the functional element is packaged facing the substrate. In this type of electronic component, a substrate is adopted that disposes the functional element itself within a sealed space. By arranging the active surface of the functional element so that it faces the substrate side, the active surface formed between the substrate and the functional element is disposed inside the sealed space.

The structure of this type of electronic component is disclosed, for example, in Japanese Unexamined Patent Application, First Publication No. H11-87406, Japanese Unexamined Patent Application, First Publication No. 2000-77458, and Japanese Unexamined Patent Application, First Publication No. 2003-92382. In order to secure the normal operation of the electronic component, a structure is known that maintains fixed sealing conditions (sealing atmosphere) such as pressure, humidity and gas type inside the sealed space. Moreover, it has been attempted to maintain fixed sealing conditions inside the sealed space by, for example, conducting sealing between the functional element and the substrate by resin or solder.

However, in the case where sealing is conducted between the functional element and the substrate by resin or solder, it may happen that stress is imparted to the functional element due to the difference between the thermal expansion coefficient of the resin or solder and the thermal expansion coefficient of the substrate. As heat is imparted in the case where resin or solder are disposed on the substrate, stress (thermal stress) is particularly imparted to the functional element in this type of manufacturing process. When stress is imparted to the functional element in this manner, stress is also imparted to the active surface, the properties of the functional element are changed, and the risk arises that the electronic component will not operate normally.

In recent years, electronic components using functional elements provided with elastic surface wave elements have become known. In electronic components using functional elements provided with elastic surface wave elements, there is particular risk that malfunctioning will occur due to the stress imparted to the functional element.

SUMMARY

An advantage of some aspects of the invention is to provide a manufacturing method for electronic component, an electronic component, and an electronic equipment, which enables to mitigate the stress imparted to the functional element.

A first aspect of the invention provides a manufacturing method for electronic component, including: preparing a first substrate having a plurality of first regions; preparing a second substrate having a plurality of second regions; facing the first region and the second region each other, and connecting the first substrate and the second substrate while disposing at least a part of a functional element within a space between the first region and the second region; obtaining a plurality of first divisional substrates by cutting the first substrate at each of the first regions, after the connecting of the first substrate and the second substrate; forming a sealing film covering the plurality of the first divisional substrates on the second substrate, after cutting the first substrate; obtaining a plurality of second divisional substrates by cutting the second substrate at each of the second regions, after forming the sealing film; and obtaining a plurality of individual electronic devices.

A second aspect of the invention provides a manufacturing method for electronic component, including: preparing a first substrate having a plurality of first regions; preparing a second substrate having a plurality of second regions; obtaining a plurality of first divisional substrates by cutting the first substrate at each of the first regions; facing each of the plurality of the first divisional substrates and each of the plurality of the second regions each other, and connecting the plurality of the first divisional substrates and the second substrate while disposing at least a part of a functional element within a space between the first region and the second region, after forming the plurality of the first divisional substrates; forming a sealing film covering the plurality of the first divisional substrates on the second substrate, after connecting the plurality of the first divisional substrates and the second substrate; obtaining a plurality of second divisional substrates by cutting the second substrate at each of the second regions, after forming the sealing film; and obtaining a plurality of individual electronic devices.

In the manufacturing method for electronic component of the first aspect of the invention or the second aspect of the invention, the space serves as a sealing space such that the functional element is sealed by placement of the functional element inside the space. The sealing film maintains fixed sealing conditions such as pressure, humidity and gas type inside the sealing space. The sealing film seals the functional element in the sealing space. The sealing film is formed on the first divisional substrate. The sealing film covers the first divisional substrate. As this type of sealing film is an extremely fine thin film, even when there is a difference between the thermal expansion coefficient of the sealing film and the thermal expansion coefficient of the substrate, it is possible to mitigate the stress imparted to the functional element that derives from the difference between the thermal expansion coefficient of the sealing film and the thermal expansion coefficient of the substrate. Moreover, in the manufacturing process of the sealing film, it is possible to form the sealing film by a low-temperature process. Accordingly, it is possible to suppress the imparting of heat to the various members of the electronic component during the manufacturing process. Accordingly, it is possible to mitigate the stress imparted to the functional element that derives from the difference between the thermal expansion coefficient of the sealing film and the thermal expansion coefficient of the substrate.

In the manufacturing method for electronic component of this invention, division is conducted according to each of the second regions of the second substrate after formation of the sealing film, and a plurality of individualized electronic components are manufactured. Accordingly, it is possible to form the sealing films of a plurality of electronic components substantially one process. Consequently, it is possible to manufacture the electronic components each of which having the sealing film inexpensively and in large quantity.

It is preferable that, in the manufacturing method for electronic component of the first aspect of the invention or the second aspect of the invention, the sealing film be metallic film.

It is preferable that, in the manufacturing method for electronic component of the first aspect of the invention or the second aspect of the invention, the material of the sealing film be chrome, titanium, copper, aluminum, or titanium tungsten.

It is preferable that, in the manufacturing method for electronic component of the first aspect of the invention or the second aspect of the invention, the sealing film be inorganic film.

It is preferable that, in the manufacturing method for electronic component of the first aspect of the invention or the second aspect of the invention, the material of the sealing film be silicon oxide, silicon nitride, alumina, or polysilazane.

Thus, in the case where metallic film or inorganic film is used as the material of the sealing film, the possibility of moisture penetration to the interior of the sealing film is low. Accordingly, it is possible to suppress the infiltration of moisture into the sealing space, and to suppress malfunctioning of the functional element deriving from the infiltration of moisture. That is, it is possible to prevent the malfunctioning of the electronic component.

In contrast, resin material, by its nature, allows moisture to penetrate to the interior. Consequently, when resin material is used as the material of the sealing film, there exists the risk that external water vapor (gas) has been absorbed into the resin material, the moisture that has penetrated the resin material will evaporate and seep into the sealing space due to temperature increases or the like. That is, resin effectively comports the possibility of being permeable to water vapor.

Accordingly, compared to resin material, when metallic film and inorganic film are used as the material of the sealing film, the possibility of moisture penetration to the interior is low, and malfunctioning of the electronic component can be prevent.

This invention does not exclude forming the sealing film with resin, and enables mitigation of the stress imparted to the functional element even in the case where the sealing film is formed with resin. Here, in the case where resin material is adopted as the material of the sealing film, it is preferable that the resin be formable at lower temperature than a transition temperature of each of the plurality of members constituting the electronic component. By this means, it is possible to form sealing film without changing the respective properties of the plurality of members constituting the electronic component.

As the specific resin material of the sealing film, the material of high-density polyethylene, vinylidene chloride, polyvinyl alcohol, nylon, or ethylene vinyl alcohol may be used.

It is preferable that, in the manufacturing method for electronic component of the first aspect of the invention or the second aspect of the invention, the sealing film be a laminated structure containing organic film and inorganic film.

A third aspect of the invention provides a electronic component including: a first divisional substrate; a second divisional substrate facing the first divisional substrate; a functional element, at least a part of which disposed within a space between the first divisional substrate and the second divisional substrate; and a sealing film covering the first divisional substrate; wherein the first divisional substrate, the second divisional substrate, the functional element, and the sealing film are formed by the above described manufacturing method.

The electronic component of this invention includes the sealing film which maintains fixed sealing conditions such as pressure, temperature and gas type inside the sealing space.

As the sealing film is an extremely fine thin film, even when there is a difference between the thermal expansion coefficient of the sealing film and the thermal expansion coefficient of the substrate, it is possible to mitigate the stress imparted to the functional element that derives from the difference between the thermal expansion coefficient of the sealing film and the thermal expansion coefficient of the substrate. Moreover, in the manufacturing process of the sealing film, it is possible to form the sealing film by a low-temperature process. Accordingly, it is possible to suppress the imparting of heat to each member during the manufacturing process. Accordingly, it is possible to mitigate the stress imparted to the functional element that derives from the difference between the thermal expansion coefficient of the sealing film and the thermal expansion coefficient of the substrate.

A third aspect of the invention provides a electronic equipment including the above described electronic component.

As the equipment includes with the aforementioned electronic component, it enables mitigation of the stress imparted to the functional element, and excels in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, embodiments of the electronic component, manufacturing method for the electronic component and the electronic equipment pertaining to this invention are described with reference to drawings. In the below drawings, the scales of the respective members have been appropriately altered so that the respective members have a readily perceivable size.

First Embodiment of the Electronic Component

Figure 1:
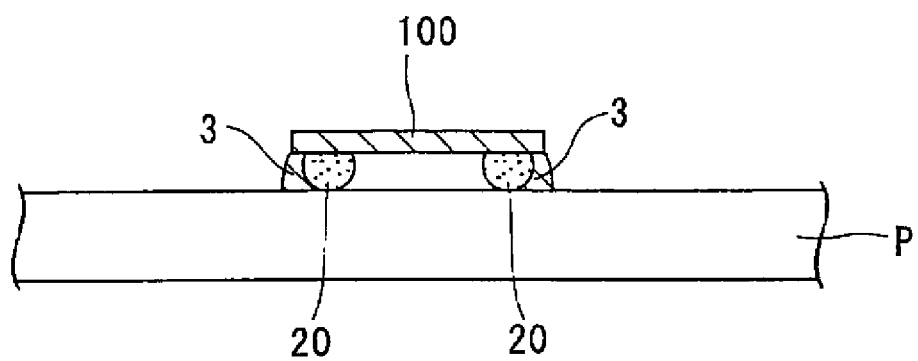
FIG. 1 is a cross-sectional view of an electronic component of a first embodiment.

FIG. 1 is a cross-sectional view of an electronic component 100 of the first embodiment.

As shown in FIG. 1, the electronic component 100 of the first embodiment is connected to a substrate P via bumps 20.

Figure 2:
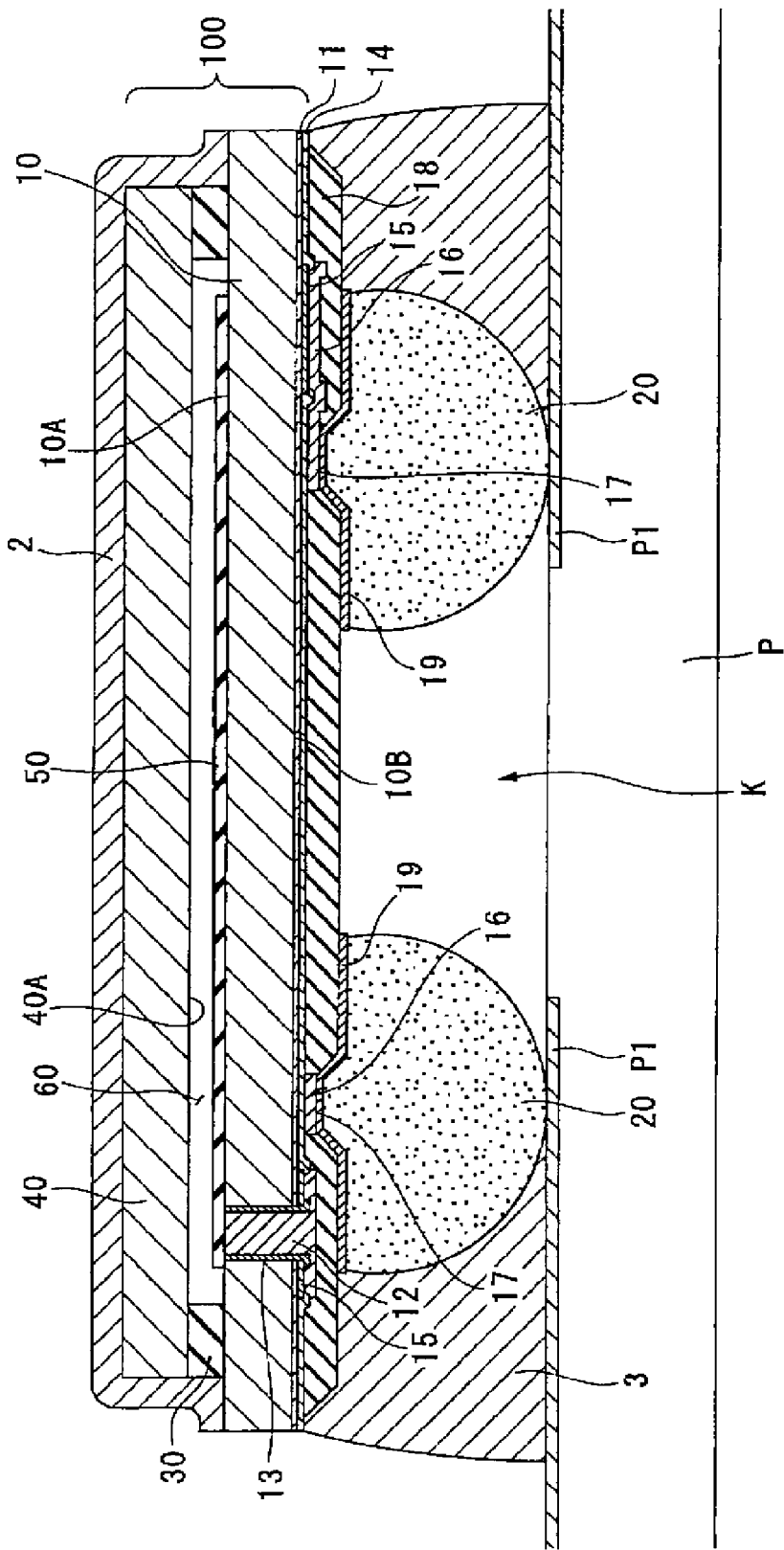
FIG. 2 is a cross-sectional view of the electronic component of the first embodiment.

FIG. 2 is a cross-sectional view of an electronic component 100 of the first embodiment in greater detail.

As shown in FIG. 2, the electronic component 100 includes with a semiconductor chip (second divisional substrate) 10 composed of a silicon substrate, a surface acoustic wave element (functional element; hereinafter referred to as SAW element) 50 formed on the element-formation face 10A of the semiconductor chip 10, and a through-hole electrode 12 which penetrates from the element-formation face 10A to the terminal-formation face 10B on the side opposite the element-formation face 10A. The SAW element 50 contains a piezoelectric thin film and a fork-type electrode which contacts the piezoelectric thin film. The SAW element 50 is formed on the element-formation face 10A of the semiconductor chip 10. An integrated circuit (not shown) containing, for example, a transistor, memory element and other electronic elements is formed on the terminal-formation face 10B of the semiconductor chip 10. One end of the through-hole electrode 12 is electrically connected to the SAW element 50 provided on the element-formation face 10A. The other end of the through-hole electrode 12 is electrically connected to the aforementioned integrated circuit provided on the terminal-formation face 10B via an electrode 15. Accordingly, the SAW element 50 provided on the element-formation face 10A of the semiconductor chip 10 and the integrated circuit provided on the terminal-formation face 10B of the semiconductor chip 10 are electrically connected via the through-hole electrode 12. Moreover, an insulating film 13 is formed on the surface of the through-hole electrode 12 which penetrates through the semiconductor chip 10. The insulating film 13 electrically insulates the through-hole electrode 12 and the semiconductor chip 10.

The electronic component 100 of the first embodiment includes a sealing member (first divisional substrate) 40. The sealing member 40 is formed by a glass substrate. The sealing member 40 may also be composed of a silicon substrate.

The sealing member 40 and semiconductor chip 10 are separated by a specified interval. The element-formation face 10A of the semiconductor chip 10 and the sealing face 40A of the sealing member 40 face each other.

The fringe of the element-formation face 10A of the semiconductor chip 10 and the fringe of the sealing face 40A of the sealing member 40 are bonded by the bonding layer 30.

The material of the bonding layer 30 is, for example, synthetic resin of polyimide resin or the like. The SAW element 50 is disposed in the interior space (space, sealing space) encompassed by the element-formation face 10A of the semiconductor chip 10, the sealing face 40A of the sealing member 40, and the bonding layer 30.

A bedding layer 11 is formed on the element-formation face 10B of the semiconductor chip 10. The material of the bedding layer 11 is, for example, insulating material such as silicon oxide ($SiO_2$). Electrodes 15 are provided in each of a plurality of specified regions on the bedding layer 11. A first insulating layer 14 is formed in the regions other than the regions where the electrodes 15 are provided. A plurality of first wirings 16 are formed on the first insulating layer 14, and a specific first wiring 15 of the plurality of first wirings 15 is electrically connected to a portion of the electrodes 15 of the plurality of electrodes 15. Moreover, a specific electrode 15 of the plurality of electrodes 15 is electrically connected to the other end of the through-hole electrode 12. A second insulating layer 18 is formed on the first insulating layer 14 so as to cover a portion of the through-hole electrode 12 and the first wirings 16. A portion of the first wirings 16 is exposed from a portion of the second insulating layer 18, and forms the land 17. The second wirings 19 are provided on the land 17, and the land 17 (first wirings 16) and the second wirings 19 are electrically connected.

A sealing film 2 which covers the bonding layer 30 and sealing member 40, is formed on the semiconductor chip 10 on which the SAW element 50 is disposed. The sealing film 2 maintains fixed sealing conditions such as pressure, humidity and gas type in the interior space 60.

This sealing film 2 is a thin film which is formed over the entire surface of the semiconductor substrate (second substrate), after the semiconductor substrate and the sealing substrate (first substrate) have been joined, the sealing substrate has been cut.

As the electronic component 100 includes this type of sealing film 2, it is possible to maintain fixed sealing conditions such as pressure, humidity and gas type in the interior space 60 between the semiconductor chip 10 and the sealing member 40.

As this sealing film is a very fine film, even when there is a difference between the thermal expansion coefficient of the sealing film 2 and the thermal expansion coefficient of the semiconductor chip 10, it is possible to mitigate the stress imparted to the SAW element 50 that derives from the difference between the thermal expansion coefficient of the sealing film 2 and the thermal expansion coefficient of the semiconductor chip 10.

Thus, according to the electronic component 100 of the first embodiment, it is possible to maintain fixed sealing conditions such as pressure, humidity and gas type in the interior space 60 between the semiconductor chip 10 and the sealing member 40. In addition, the stress imparted to the SAW element 50 can be mitigated, and the normal operation of the electronic component 100 can be secured.

As the material of the sealing film 2, metallic film and inorganic film is used.

Specifically, as metallic film material, chrome (Cr), titanium (Ti), copper (Cu), aluminum (Al), or titanium tungsten (TiW) may be adopted.

As inorganic film material, silicon oxide ($SiO_2$), silicon nitride (SiN), alumina ($Al_2O_3$), or polysilazane may be adopted.

As the structure of the sealing film 2, a laminated structure of organic film and inorganic film may be used.

If it is merely for purposes of mitigating the stress imparted to the SAW element 50, as the sealing film 2, thin film composed of resin may be used. As resin material comports the possibility of being permeable to water vapor as mentioned above, it is preferable to use metallic film or inorganic film as the sealing film 2. In the case where resin material is used as the material of the sealing film 2, it is preferable that the resin be formable at a lower temperature than a transition temperature of the respective plurality of members constituting the electronic component. By this means, it is possible to form the sealing film 2 without changing the properties of the respective members constituting the electronic component 100. As specific materials of the sealing film 2, the resin materials of high-density polyethylene, vinylidene chloride, polyvinyl alcohol (PVA), nylon, or ethylene vinyl alcohol may be adopted.

Bumps (conductive projections) 20 which are the connection terminals with external equipment, are formed on the second wirings 19. The bumps 20 are formed on the terminal-formation face 10B of the semiconductor chip 10, and the electronic component 100 is electrically connected to the substrate P via the bumps 20.

As the forming material of the bumps 20, anything that forms a conductive member may be used, but generally a lead-free solder, gold or the like is used.

The substrate P includes wiring patterns P1. These wiring patterns P1 are electrically connected to the electronic component 100 via the bumps 20. As the substrate P, a print wiring substrate that forms the wiring pattern in resin, a silicon substrate that forms a wiring pattern, a glass substrate that forms a wiring pattern, or the like may be used.

Sealing resin 3 is disposed on the outer side of the bumps 20 so as to surround a space K between the electronic component 100 and the substrate P. By means of this sealing resin 3, it is possible to easily prevent infiltration of gas from the outside into the space K.

As an example of the sealing resin 3, conventional sealing resins may be used, epoxy resin, polyimide resin or the like may be used.

First Embodiment of the Manufacturing Method for Electronic Component

Next, a description is given of the manufacturing method for the electronic component 100 of the first embodiment configured as stated above. As explained below, a plurality of electronic components 100 are formed on the same semiconductor substrate (second substrate) 110 shown in FIG. 3, but to facilitate explanation, there are instances where only a portion of the semiconductor substrate 110 corresponding to a single electronic component 100 is represented and illustrated in the below drawings.

Preparation of the Semiconductor Substrate

Figure 3:
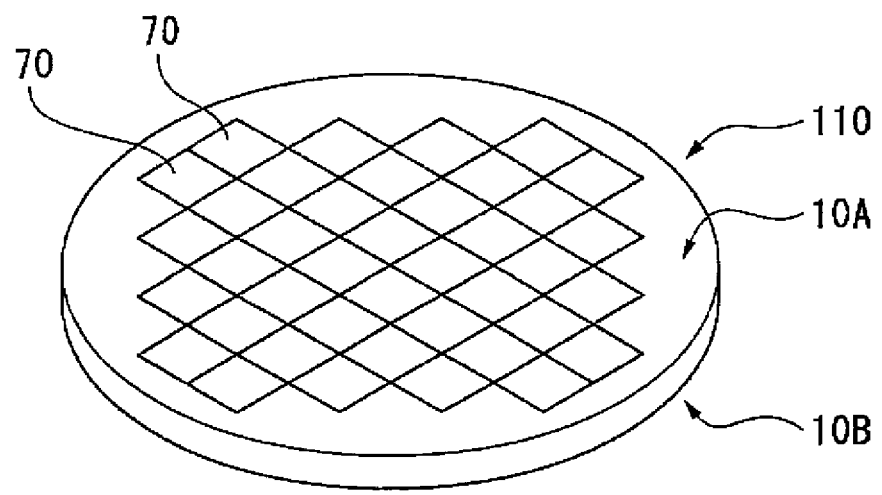
FIG. 3 is a perspective view for explaining the manufacturing method for electronic component of the first embodiment.

A semiconductor substrate (second substrate) 110 having a plurality of semiconductor regions (second regions) 70 as shown in FIG. 3 is prepared. The semiconductor substrate 110 has an element-formation face 10A and a terminal-formation face 10B. As the element-formation face 10A on the semiconductor substrate 110 and the element-formation face 10A of the aforementioned semiconductor chip 10 are the identical face, the same reference symbol is applied. As the terminal-formation face 10B on the semiconductor substrate 110 and the terminal-formation face 10B of the aforementioned semiconductor chip 10 are the identical face, the same reference symbol is applied.

The semiconductor regions 70 are demarcated into a plurality of regions on the element-formation face 10A. By dicing the semiconductor substrate 110 in a subsequent process, each of the plurality of semiconductor regions 70 are divided, it becomes a plurality of individualized semiconductor chips 10.

Manufacturing Process of Insulating Layer, Wiring and Land on the Terminal-Formation Face of the Semiconductor Substrate A description is now given of the manufacturing process of the insulating layer, wiring and land on the terminal-formation face 10B of the semiconductor substrate 110 with reference to FIG. 4 to FIG. 10.

Below, with regard to the semiconductor substrate 110, only the components which subsequently constitute the semiconductor chip 10 are shown in the drawing.

Figure 4:
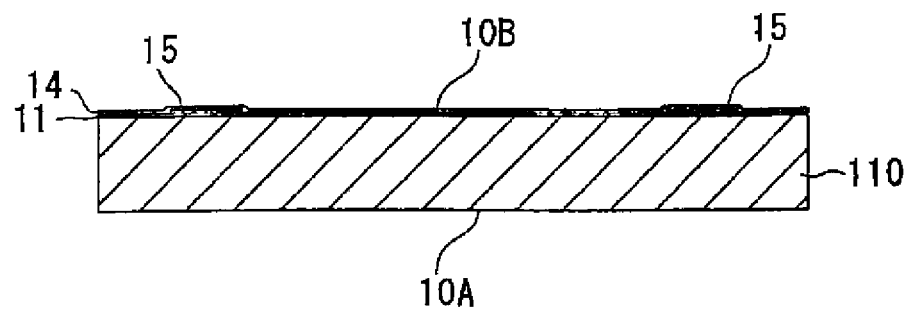
FIG. 4 is a cross-sectional view for explaining the manufacturing method for electronic component of the first embodiment.

First, as shown in FIG. 4, the bedding layer 11 is formed on top of the terminal-formation face 10B of the semiconductor substrate 110, and electrodes 15 are formed on the bedding layer 11.

An integrated circuit (not illustrated) containing, for example, a transistor, memory element and other electronic elements is formed on top of the terminal-formation face 10B of the semiconductor substrate 110. The bedding layer 11 is an insulating layer, and is formed by a silicon (Si) oxide film ($SiO_2$). The electrodes 15 are electrically connected to the aforementioned integrated circuit, and are formed by titanium (Ti), titanium nitride (TiN), aluminum (Al), copper (Cu) and the like. The first insulating layer 14 is then formed so as to cover the bedding layer 11 and the electrodes 15.

The material of the first insulating layer 14 may be polyimide resin, silicon-modified polyimide resin, epoxy resin, silicon-modified epoxy resin, acrylic resin, phenol resin, benzocyclobuten (BCB), polybenzoxazole (PBO) or the like. Alternatively, the material of the first insulating layer 14 may be other materials so long as they have insulative properties such as silicon oxide ($SiO_2$) and silicon nitride (SiN).

Next, a photoresist (not illustrated) is applied to the entire surface of the first insulating layer 14 by the spin coat method or the like. Light exposure treatment is then conducted using a mask on which the prescribed pattern is formed, and developing treatment is conducted. By this means, the photoresist is patterned into the prescribed form.

Figure 5:
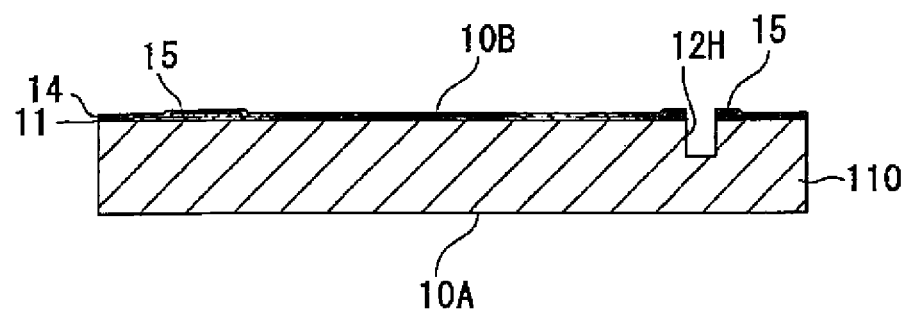
FIG. 5 is a cross-sectional view for explaining the manufacturing method for electronic component of the first embodiment.

Etching treatment is then conducted. In the drawing, an aperture is formed by removing a portion of the first insulating layer 14 that covers the right-side electrode 15. Next, the photoresist on the first insulating layer 14 forming the aforementioned aperture is used as a mask, and a portion of the electrode 15 on the right side in the drawing of the plurality of electrodes 15 is opened by dry etching. Furthermore, the portions of the bedding layer 11 and semiconductor substrate 110 corresponding to the aperture are removed by etching. By this means, as shown in FIG. 5, a hole 12H is formed in a portion of the terminal-formation face 10B of the semiconductor substrate 110.

Next, insulating film 13 is formed on top of the first insulating layer 14 and on the inner walls and bottom face of the hole 12H. The insulating film 13 is formed in order to prevent corrosion and the like of the semiconductor substrate 110 due to the occurrence of current leakage, oxygen, moisture and the like. As the material of the insulating film 13, tetraethylorthosilicate ($Si(OC_2H_5)_4$: hereinafter TEOS) formed using PECVD (plasma enhanced chemical vapor deposition), that is, PE-TEOS, or TEOS formed using ozone CVD, that is, $O_3$-TEOS, or silicon oxide ($SiO_2$) formed using CVD may be used. So long as the insulating film 13 has insulative properties, resin and other materials are also acceptable.

Figure 6:
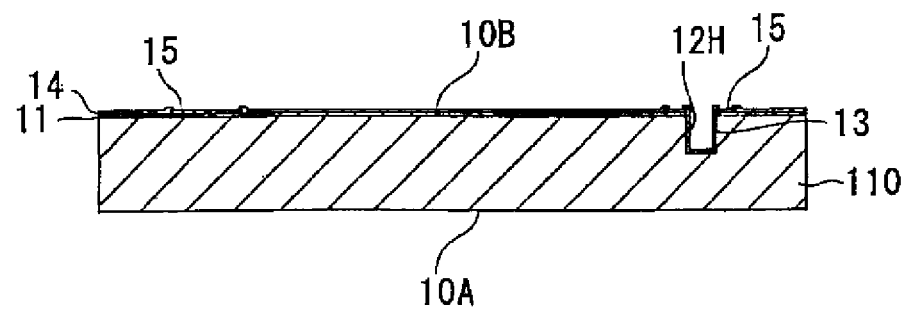
FIG. 6 is a cross-sectional view for explaining the manufacturing method for electronic component of the first embodiment.

Next, a photoresist (not illustrated) is applied to the entire surface of the insulating film 13 by the spin coat method or the like. Light exposure treatment is then conducted using a mask on which the prescribed pattern is formed, and developing treatment is conducted. By this means, the photoresist is patterned into the prescribed form. As shown in FIG. 6, by conducting etching to remove the insulating film 13 and the first insulating layer 14 provided on top of the electrodes 15. In addition, insulating film 13 is formed on the inner walls and bottom face of the hole 12H.

Figure 7:
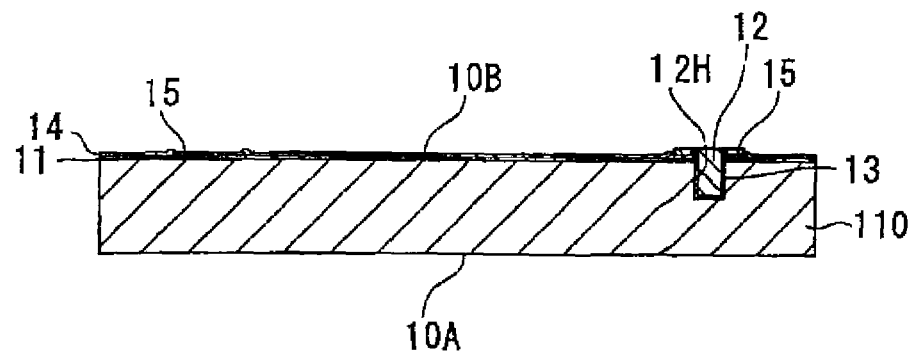
FIG. 7 is a cross-sectional view for explaining the manufacturing method for electronic component of the first embodiment.

Next, using the electrochemical plating (ECP) method, plating treatment is conducted on the inner walls of the hole 12H and on top of the electrode 15. By this means, conductive material that serves to form the through-hole electrode 12 is disposed on the inner sides of the hole 12H. As an example of the conductive material which serves to the form the through-hole electrode 12, copper (Cu) may be used, and the copper (Cu) may be embedded in the hole 12H. By this means, the through-hole electrode 12 is formed in a shape that projects on top of the electrode 15, as shown in FIG. 7. The process which forms the through-hole electrode 12 in the first embodiment includes a process which forms (laminates) TiN and Cu by the spatter method and a process which forms Cu by the plating method. It may also include a process a process which forms (laminates) TiW and Cu by the spatter method and a process which forms Cu by the plating method. The forming method of the through-hole electrode 12 is not limited to the above-stated methods, and it is also acceptable to embed conductive paste, molten metal, metal wire and the like.

Figure 8:
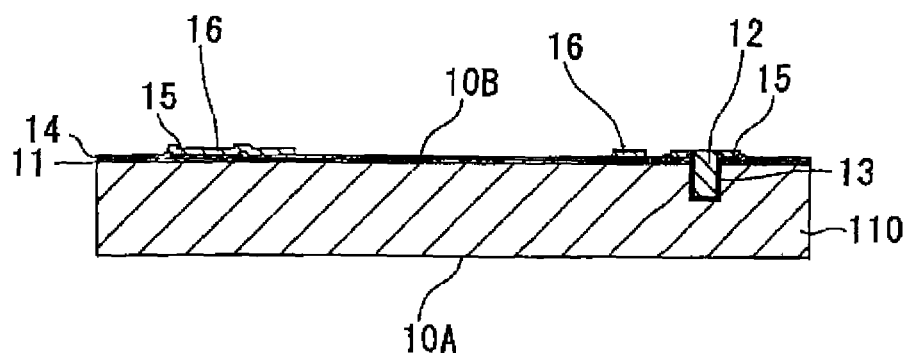
FIG. 8 is a cross-sectional view for explaining the manufacturing method for electronic component of the first embodiment.

Next, as shown in FIG. 8, a plurality of first wirings 16 are formed on top of the first insulating layer 14. A portion of the first wirings 16 of the plurality of first wirings 16, are formed so as to electrically connect to the electrode 15 on the left side of the drawing. The first wirings 16 are formed from material containing one or more of copper (Cu), chrome (Cr), titanium (Ti), nickel (Ni), tungsten-titanium (TiW), gold (Au), silver (Ag), aluminum (Al), nickel-vanadium (NiV), tungsten (W), titanium nitride (TiN), and lead (Pb). The first wirings 16 may also be formed by laminating at least two materials from among these materials. The process which forms the first wirings 16 in the first embodiment includes a process which conducts formation by the spatter method in the sequence of TiW, Cu and TiW. It may also include a process which conducts formation by the spatter method in the sequence of TiW and Cu and a process which forms Cu by the plating method.

Figure 9:
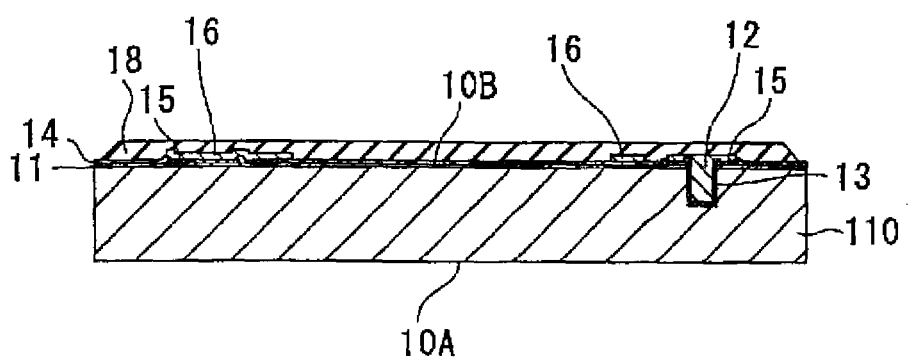
FIG. 9 is a cross-sectional view for explaining the manufacturing method for electronic component of the first embodiment.

Next, as shown in FIG. 9, the second insulating layer 18 is formed so as to cover the through-hole electrode 12, first wirings 16, and first insulating layer 14. As the material of the second insulating layer 18, polyimide resin, silicon-modified polyimide resin, epoxy resin, silicon-modified epoxy resin, acrylic resin, phenol resin, benzocyclobuten (BCB), polybenzoxazole (PBO) or the like may be used. Alternatively the material of the second insulating layer 18 may be silicon oxide ($SiO_2$) or silicon nitride (SiN). This second insulating layer 18 may also be formed with other materials so long as they have insulative properties.

Figure 10:
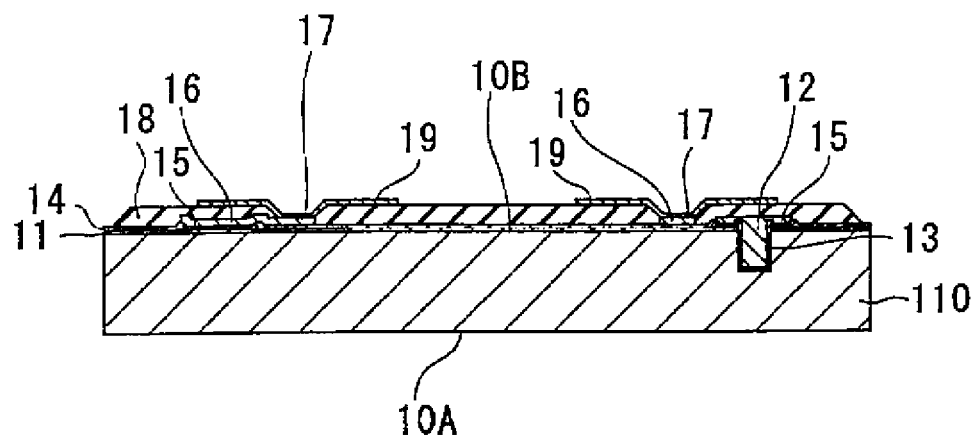
FIG. 10 is a cross-sectional view for explaining the manufacturing method for electronic component of the first embodiment.

Next, the region of the second insulating layer 18 corresponding to the land 17 is removed. A portion of the first wirings 16 are exposed, and the land 17 is formed. When the region of the second insulating layer 18 corresponding to the land is removed, the photolithography method including light exposure treatment and developing treatment are used. As shown in FIG. 10, the second wirings 19 are then formed on the second insulating layer 18.

The Manufacturing Process of the Saw Element on the Element Formation Face of the Semiconductor Substrate The manufacturing process of the SAW element on the element formation face 10A of the semiconductor substrate 110 is described as follows with reference to FIG. 11 and FIG. 12.

Below, only the parts of the semiconductor substrate 110 that subsequently constitute the semiconductor chip 10 are illustrated.

First, a glass plate (not illustrated) is affixed to the terminal formation face 10B of the semiconductor substrate 110 with interposition of a removable adhesive by irradiation with ultraviolet light (UV light). This glass plate is one of the elements of what is referred to as a WSS (wafer support system), and the semiconductor substrate is supported by this glass plate. The prescribed treatment such as grinding treatment, dry etching treatment or wet etching treatment is then conducted on the element formation face 10A of the semiconductor substrate 110 in a state where the glass plate and semiconductor substrate 110 are joined, and where the element formation face 10A is exposed.

Figure 11:
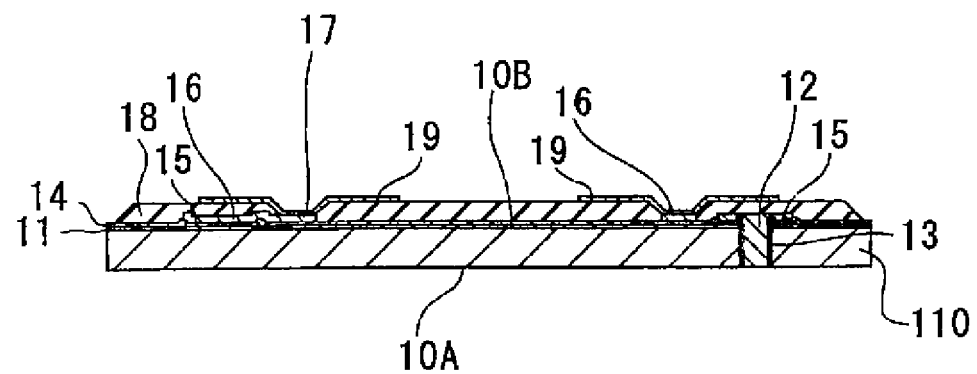
FIG. 11 is a cross-sectional view for explaining the manufacturing method for electronic component of the first embodiment.

By this means, as shown in FIG. 11, the film thickness of the semiconductor substrate 110 is thinned, and one end of the through-hole electrode 12 is exposed from the element formation face 10A.

Figure 12:
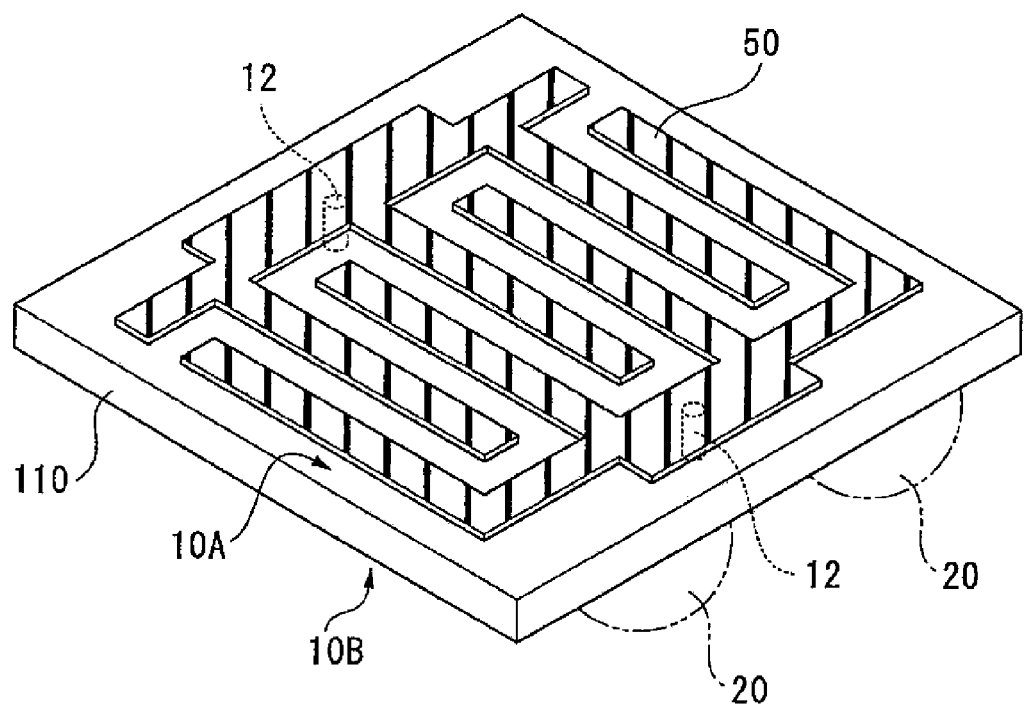
FIG. 12 is a perspective view for explaining the manufacturing method for electronic component of the first embodiment.

Next, as shown in FIG. 12, the SAW element 50 is formed on the element formation face 10A of the semiconductor substrate 110. SAW elements 50 are formed in each of the plurality of semiconductor regions 70 (see FIG. 3). The process which forms the SAW element 50 includes a process which forms a piezoelectric thin film, a process which forms a fork-type electrode so as to contact the piezoelectric thin film, and a process which forms a protective film. Furthermore, the process which forms the SAW element 50 also includes a process which conducts frequency adjustment by irradiating the SAW element 50 with plasma or the like. As material for forming the piezoelectric thin film, zinc oxide (ZnO), aluminum nitride (AlN), lithium niobate ($LiNbO_3$), lithium tantalate ($LiTaO_3$), potassium niobate ($KnNbO_3$) and the like may be cited. As material for forming the protective film, silicon oxide ($SiO_2$), silicon nitride ($Si_3N_4$), titanium nitride (TiN) and the like may be cited. This type of SAW element 50 is electrically connected to one end of the through-hole electrode 12 exposed on the element formation face 10A.

Preparation of Sealing Substrate

Figure 13:
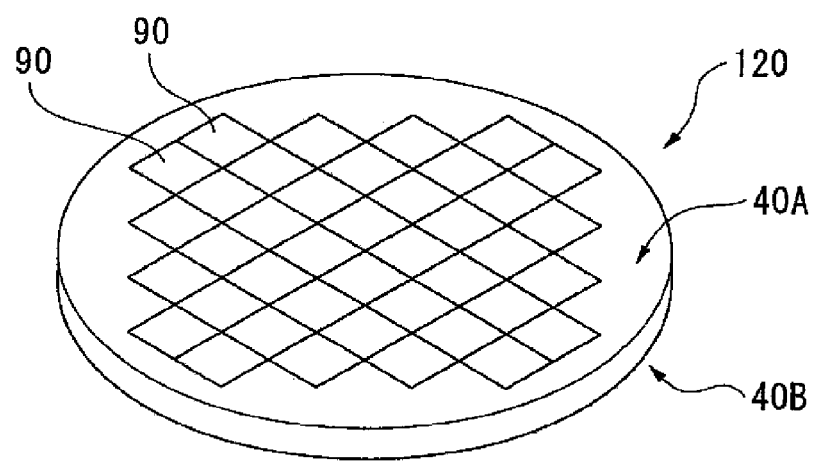
FIG. 13 is a perspective view for explaining the manufacturing method for electronic component of the first embodiment.

A sealing substrate (first substrate) 120 having a plurality of sealing regions (first regions) 90 as shown in FIG. 13 is prepared. The sealing substrate 120 has a sealing face 40A and a thin-film formation face 40B. As the sealing face 40A of the sealing substrate 120 and the sealing face 40A of the aforementioned semiconductor chip 10 are identical, the same reference symbol is applied. Moreover, as the thin-film formation face 40B of the sealing substrate 120 and the thin-film formation face 40B of the aforementioned semiconductor chip 10 are identical, the same reference symbol is applied.

The sealing regions 90 are demarcated into a plurality of regions on the sealing face 40A. By conducting dicing of the sealing substrate 120 in a subsequent process, the plurality of sealing regions 90 are divided, and become a plurality of individualized sealing members 40.

Process of Joining Semiconductor Substrate and Sealing Substrate

Figure 14A:
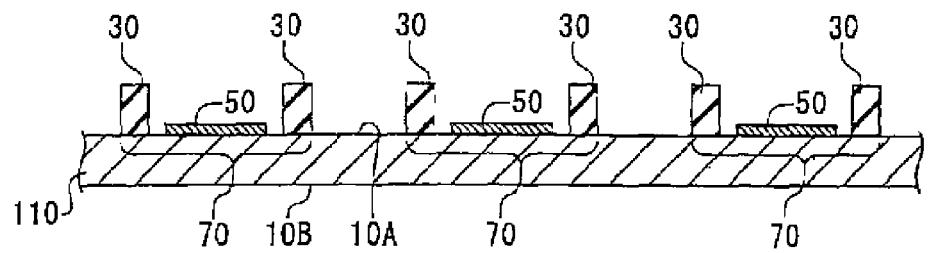
FIGS. 14A to 14D are cross-sectional views for explaining the manufacturing method for electronic component of the first embodiment.
Figure 14B:
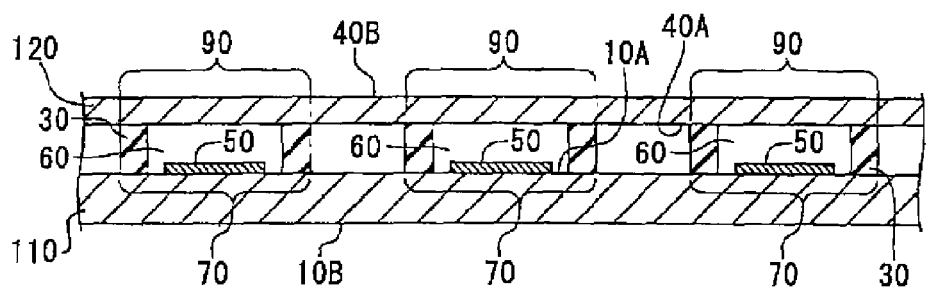

Next, as shown in FIGS. 14A to 14B, a description is given of the process which joins the semiconductor substrate and the sealing substrate.

First, as shown in FIG. 14A, adhesive layers 30 are formed at the fringes of each of the plurality of semiconductor regions 70 on the semiconductor substrate 110.

In the first embodiment, the adhesive layers 30 are formed on the semiconductor substrate 110, but it is also acceptable to form the adhesive layers 30 at the fringes of each of the plurality of sealing regions 90 of the sealing substrate 120. As the adhesive layers 30, a photosensitive polyimide adhesive or the like may for example be used.

Next, as shown in FIG. 14B, the semiconductor substrate 110 and sealing substrate 120 are placed facing each other. The semiconductor substrate 110 and sealing substrate 120 are then joined so that the semiconductor regions 70 and sealing regions 40 are faced each other. By this means, the SAW elements 50 formed in each of the plurality of semiconductor regions 70 are disposed in an interior space encompassed by the semiconductor region 70, sealing region 90 and adhesive layers (adhesive layers) 30. Accordingly, a structure is formed where the SAW element 50 is sealed inside the interior space 60. In this type of sealing structure, vacuum sealing where the interior space 60 is maintained in a vacuum state, gas replacement sealing where the interior space 60 is flushed with a prescribed gas such as $N_2$, Ar, He or the like, and so on may be adopted.

In the semiconductor substrate 110 and sealing substrate 120, it is also acceptable to form metal projections along the fringes of the semiconductor regions 70, and to form a metal layer that is electrically connected to the metal projections on the sealing face 40A. In this case, when the semiconductor substrate 110 and sealing substrate 120 are joined, the metal projections and the metal layer are electrically connected.

Glass may be used as the material of the sealing substrate 120. In this case, it is possible to conduct frequency adjustment of the SAW element 50 by laser irradiation or the like after sealing.

Process of Cutting Sealing Substrate

Figure 14C:
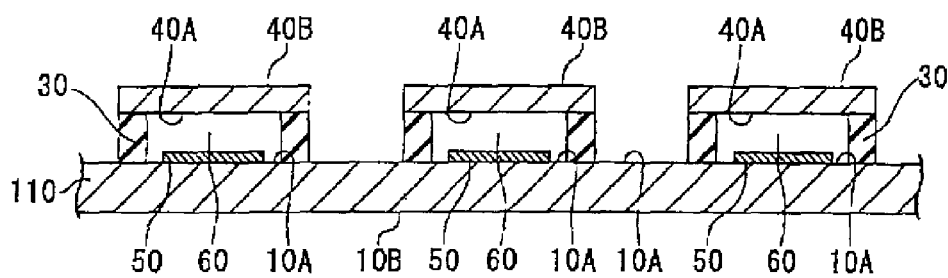

Next, as shown in FIG. 14C, a description is given of the process which cuts the sealing substrate.

As shown in FIG. 14C, the sealing substrate 120 only undergoes dicing (cutting) by a dicing apparatus that is not illustrated in the drawing. The dicing is conducted from the thin-film formation face 40B of the sealing substrate 120. By this means, the plurality of sealing regions 90 on the sealing substrate 120 are individually divided. Accordingly, each of the plurality of sealing members 40 is formed on the semiconductor substrate 110 via the adhesive layer 30.

Process of Forming Sealing Film

Figure 14D:
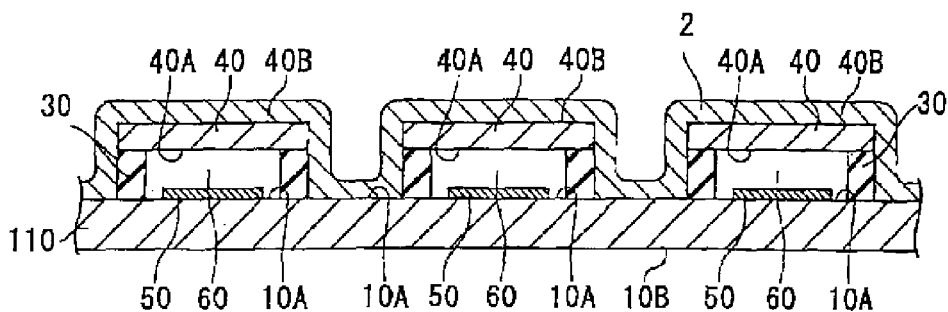

Next, as shown in FIG. 14D, a description is given of the process which forms the sealing film.

As shown in FIG. 14D, the sealing film 2 is formed so as to cover the sealing members 40 formed on the semiconductor substrate 110. Specifically, in the case where metal thin film is used as the material of the sealing film 2, sealing film 2 is formed by the vapor deposition method, spatter method, CVD (chemical vapor deposition) method, the plating method, or the like. In the case where inorganic film is used as the material of the sealing film 2, the sealing film 2 is formed by the vapor deposition method, spatter method, CVD method, a wet method (for example, spin coat method, dip method, spray method or the like), or the like.

The process which forms this type of sealing film 2 can be conducted at low temperature compared to the process which forms resin members for sealing so as to cover the sealing members 40. For example, the sealing film 2 can be formed at room temperature by dissolving the material of the sealing film 2 in a solvent, applying this liquid, and subsequently evaporating the solvent by natural drying. Consequently, it is possible to prevent thermal damage to the SAW 50 in the process which forms the sealing film 2. It is also possible to suppress the application of heat to the elements and the like formed on the semiconductor substrate 110 before the sealing film 2. Accordingly, it is possible to mitigate the stress that is imparted to the SAW element 50 that derives from the difference between the thermal expansion coefficient of the sealing film 2 and the thermal expansion coefficient of the substrate P. By this means, it is possible to prevent changes to the properties of, for example, the frequency fluctuations and the like of the SAW element 50.

Process of Cutting Semiconductor Substrate

Next, the semiconductor substrate 110 only is subjected to dicing by using the same aforementioned dicing device that is not illustrated in the drawing. In addition, dicing is conducted from the terminal formation face 10B of the semiconductor substrate 110. By this means, the plurality of semiconductor regions 70 on the semiconductor substrate 110 are individually divided. Accordingly, a plurality of individualized electronic components 10 are manufactured.

According to the manufacturing method for electronic component of the first embodiment, the process which forms the sealing film 2 is conducted substantially one process, and a plurality of semiconductor regions 70 are subsequently divided by dicing of the semiconductor substrate 110, with the result that the sealing film 2 can be formed at one time in a plurality of electronic components 10. Consequently, it is possible to manufacture electronic components 100 provided with sealing film 2 inexpensively and in large quantity.

Figure 15:
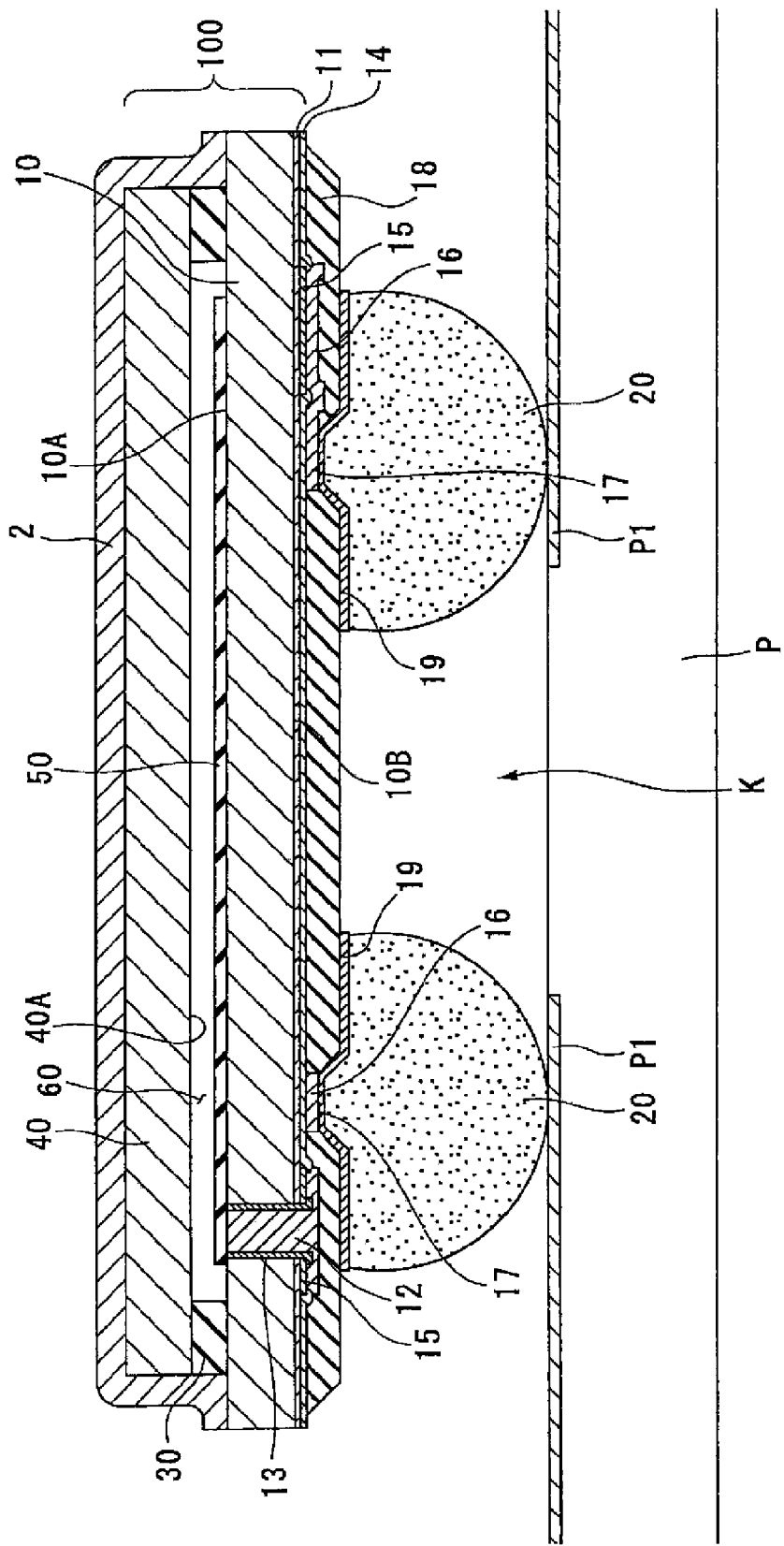
FIG. 15 is a cross-sectional view for explaining the manufacturing method for electronic component of the first embodiment.

Next, as shown in FIG. 15, the electronic component 100 is connected to the wiring P1 of the substrate P via the bumps 20. A region for installation of the electronic component 100 is formed in advance in the wiring P1, and the electronic component 100 is electrically connected to the prescribed region of the wiring P1 via the bumps 20. Specifically, the bumps 20 composed, for example, of lead free solder are formed on the prescribed regions of the second wirings 19 or the wiring P1 formed on the terminal formation face 10B of the electronic component 100, and the electronic component 100 and the substrate P are electrically connected by joining the electronic component 100 and the substrate P via the bumps 20. When forming the bumps 20, it is acceptable to have a mode where the solder ball is formed on the prescribed region of the second wirings 19 or the wiring P1, or to print solder paste on the prescribed regions of the second wirings 19 or wiring P1.

Next, sealing resin 3 is formed on the outer sides of the bumps 20 so as to surround the space K between the electronic component 100 and the substrate P. Specifically, resin is applied by a dispenser or the like to the outer sides of the bumps 20 so as to surround the space K between the electronic component 100 and the substrate P. The viscosity and thixotropic properties of the resin applied from the dispenser or the like are appropriately adjusted so that resin does not flow into the space K between the electronic component 100 and the substrate P. The viscosity and thixotropic properties of the resin can be adjusted by adjusting the content of inorganic material relative to resin, the compositional proportions of the resin, or the like. In the case where the resin applied by a dispenser or the like is heat-curable resin, the sealing resin 3 is formed by application of caloric value to the applied resin. In the case where the resin applied by a dispenser or the like is photo-curable resin, the sealing resin 3 is formed by irradiating the applied resin with light.

According to the foregoing process, the electronic component 100 of the first embodiment is packaged on the substrate P as shown in FIG. 1 and FIG. 2.

Second Embodiment of the Manufacturing Method for Electronic Component

Next, a description is given of the manufacturing method for the electronic component 100 of a second embodiment.

In the aforementioned first embodiment of the manufacturing method for electronic component, a plurality of sealing regions 90 are individually divided by conducting dicing after joining the sealing substrate 120 and the semiconductor substrate 110.

In a second embodiment of the manufacturing method for electronic component, the sealing regions 90 are individually divided by first conducting dicing of the sealing substrate 120, and subsequently affixing each of the plurality of sealing members 40 to the semiconductor substrate 110.

Below, the second embodiment of the manufacturing method for electronic component is described. Where the configuration is identical to that of the aforementioned first embodiment of the manufacturing method for electronic component, the same reference symbols are applied, and description is omitted.

Figure 16A:
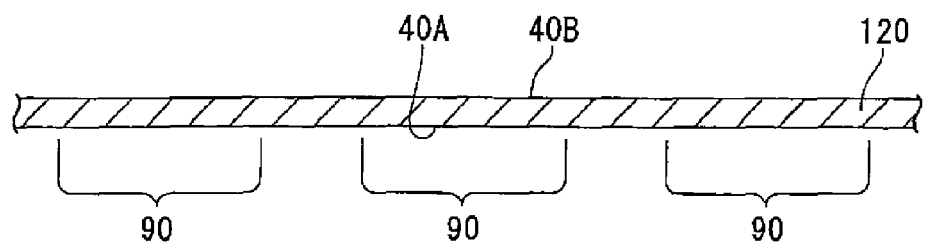
FIGS. 16A to 16D are cross-sectional views for explaining the manufacturing method for electronic component of a second embodiment.

First, as shown in FIG. 16A, a sealing substrate 120 is prepared. The sealing substrate 120 has a plurality of sealing regions 90 as shown in FIG. 13.

Figure 16B:
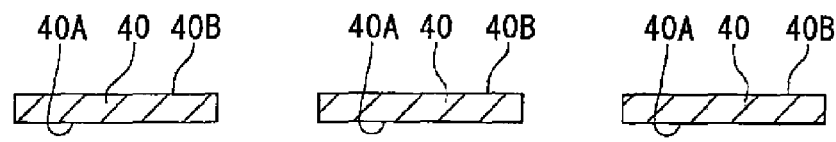

Next, as shown in FIG. 16B, the sealing substrate 120 undergoes dicing by a dicing device which is not illustrated in the drawing, and sealing members (chips) 40 having the sealing regions 90 are formed.

Figure 16C:
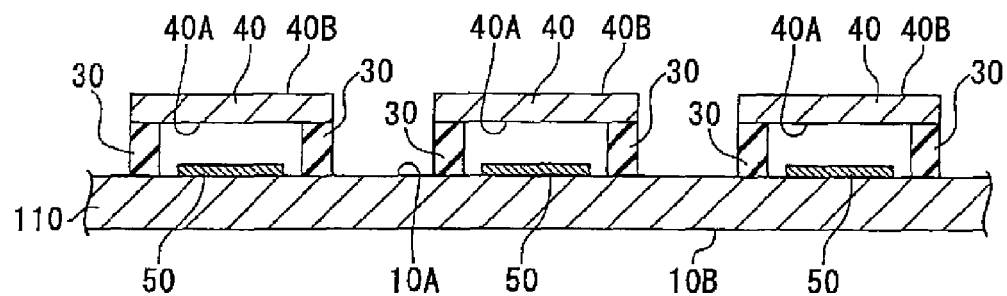

Next, as shown in FIG. 16C, each of the plurality of sealing members 40 is affixed to each of the plurality of semiconductor regions 70 on the semiconductor substrate 110 with interposition of an adhesive layer 30. By this means, an SAW element 50 is disposed inside a space 60 between the semiconductor region 70 and sealing region 90 that face each other.

Figure 16D:
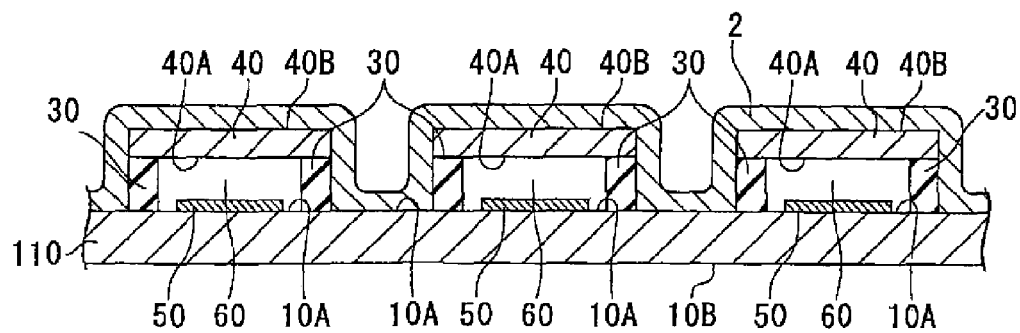

Next, as shown in FIG. 16D, sealing film 2 is formed so as to cover the sealing members 40 formed on the semiconductor substrate 110.

Subsequently, the semiconductor substrate 110 only is subjected to dicing. The dicing is conducted from the terminal formation face 10B of the semiconductor substrate 110. By this means the plurality of semiconductor regions 70 on the semiconductor substrate 110 are individually divided. Accordingly, a plurality of individualized electronic components 10 are manufactured.

In the second embodiment of this manufacturing method for electronic component, the same effects are obtained as in the aforementioned first embodiment of the manufacturing method for electronic component.

Second Embodiment of the Electronic Component

Next, a second embodiment of this invention is described. In the description of the second embodiment, description of parts identical to those of the aforementioned first embodiment is omitted or simplified.

Figure 17:
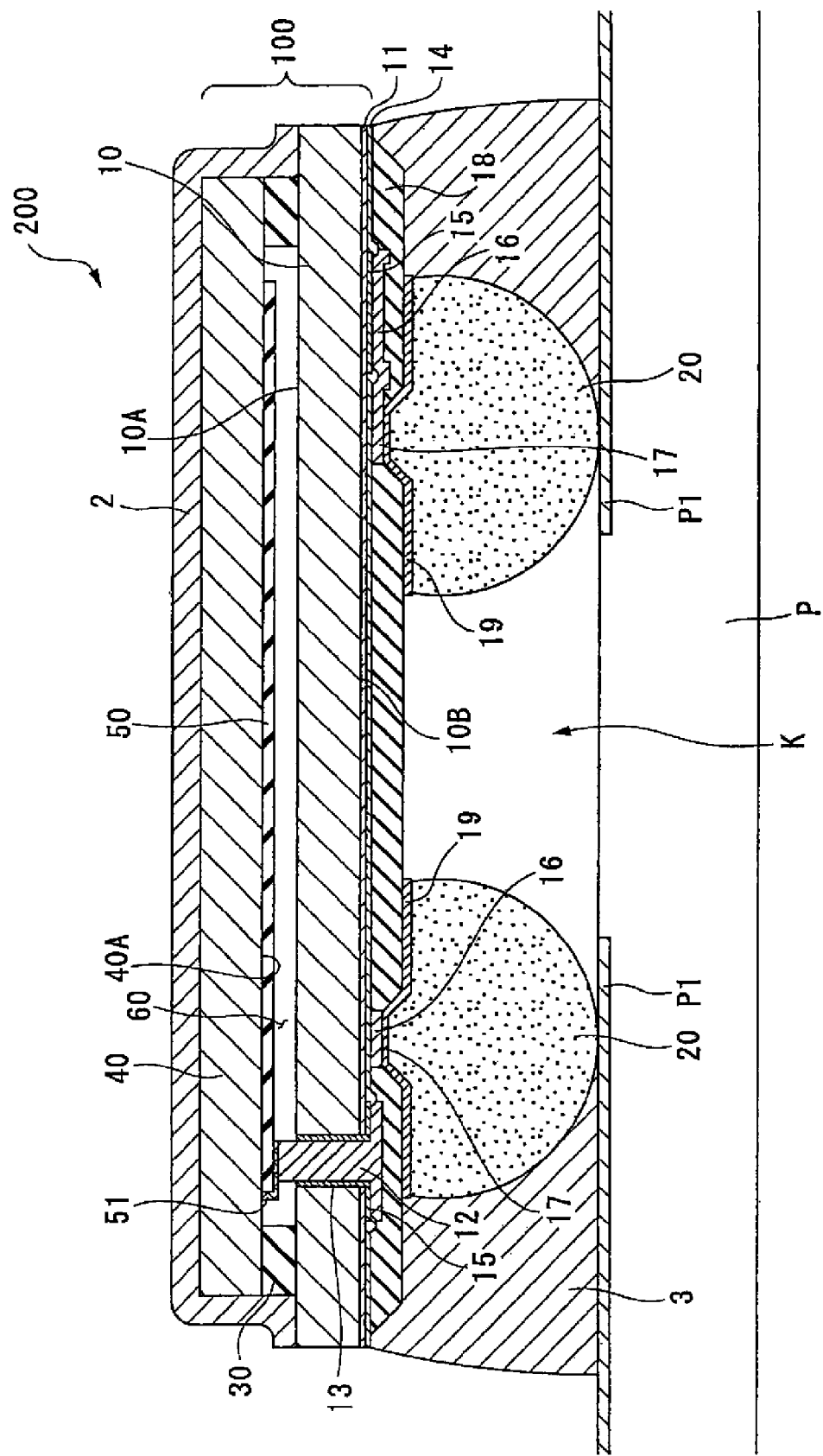
FIG. 17 is a cross-sectional view of an electronic component of the second embodiment.

FIG. 17 is a cross-sectional view of an electronic component 200 of the second embodiment. As shown in this drawing, in the electronic component 200 of the second embodiment, the SAW element 50 is not formed on the element formation face 10A of the semiconductor chip 10, but is formed on the sealing face 40A of the sealing member 40. The sealing face 40A faces the element formation face 10A. Accordingly, the SAW element 50 is formed separately from the element formation face 10A. In the second embodiment, by providing the SAW on a member that is different from the semiconductor chip 10, the effects of the thermal stress and film stress imparted to the semiconductor chip 10 are impeded, with the result that satisfactory properties can be obtained. In this case, the sealing members 40 are configured from a silicon substrate, quartz substrate, and a substrate containing silicon and diamond. Moreover, in the second embodiment, one end of the through-hole electrode 12 is formed to project from the element formation face 10A of the semiconductor chip 10. The manufacturing method of this electronic component 200 forms the SAW element 50 in advance on the sealing face 40A of the sealing member 40, and joins the semiconductor chip 10 (or the semiconductor substrate 110) and sealing member 40 (or sealing substrate 120) via the adhesive layer 30. One end of the through-hole electrode 12 which projects from the element formation face 10A is electrically connected to the terminal 51 of the SAW element 50. To facilitate metallic connection, it is preferable to conduct surface treatment of gold and the like or to provide brazing material on the surfaces of the one end of the through-hole electrode 12 and the terminal 51. Alternatively, it is also acceptable to connect the one end of the through-hole electrode 12 and the terminal 51 by pressure welding that utilizes the contraction of the adhesive layer 30.

The Third Embodiment of the Electronic Component

Next, a description is given of the third embodiment of this invention. In the description of the third embodiment, description of parts identical to those of the aforementioned first embodiment is omitted or simplified.

Figure 18:
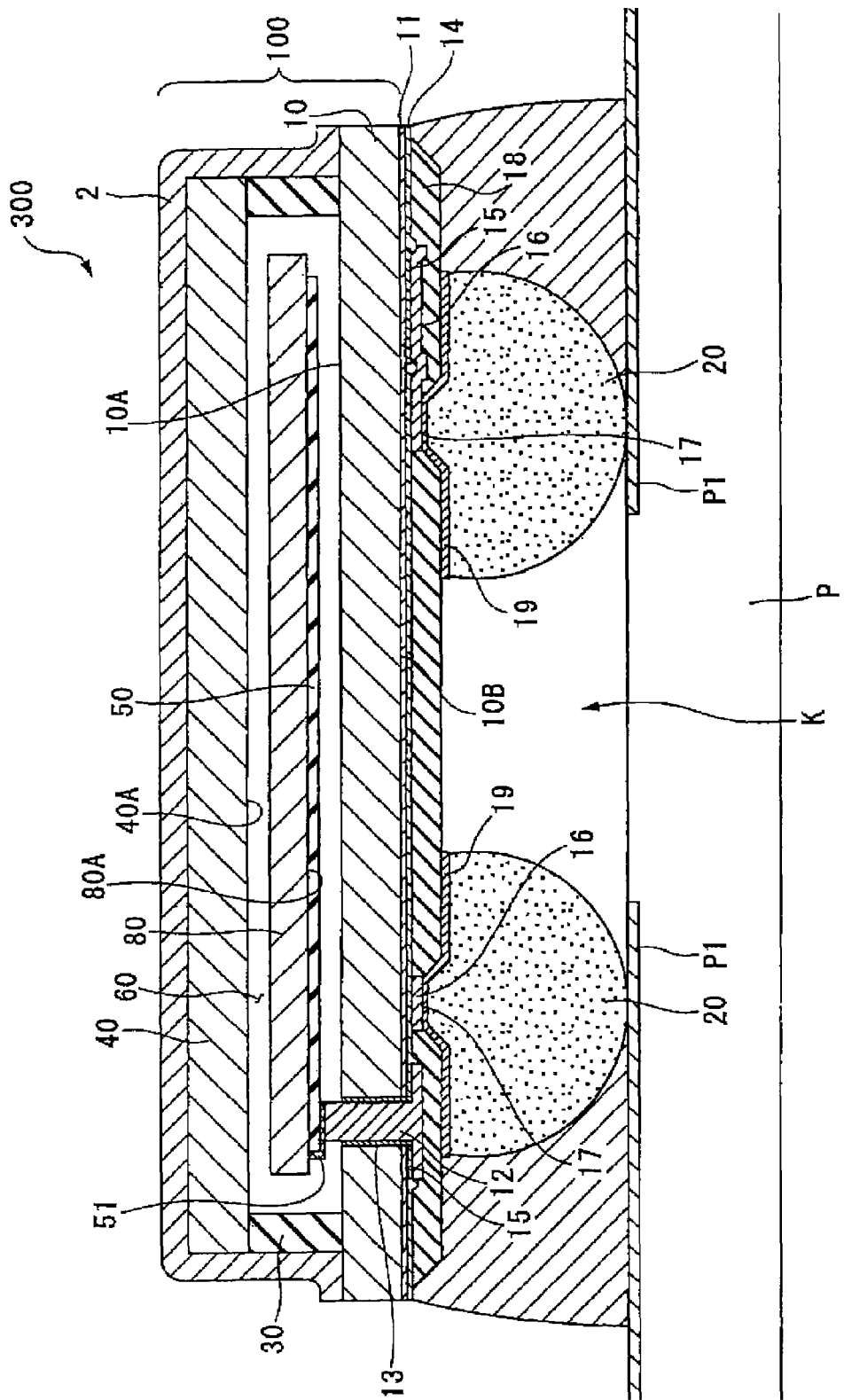
FIG. 18 is a cross-sectional view of an electronic component of a third embodiment.

FIG. 18 is a cross-sectional view of an electronic component 300 of the third embodiment. As shown in this drawing, in the electronic component 300 of the third embodiment, the SAW element 50 is provided on the element substrate 80 disposed between the element formation face 10A of the semiconductor chip 10 and the sealing member 40. In the third embodiment, by providing the SAW on a member which is different from the semiconductor chip 10 as in the aforementioned second embodiment, the effects of the thermal stress and film stress imparted to the semiconductor chip 10 are impeded, with the result that satisfactory properties can be obtained. The SAW element 50 is provided inside the element substrate 80 on the face 80A. The face 80A faces the element formation face 10A of the semiconductor chip 10. The element substrate 80 is configured from a silicon substrate, quartz substrate, and a substrate containing silicon and diamond. Moreover, in the third embodiment, one end of the through-hole electrode 12 is formed to project from the element formation face 10A of the semiconductor chip 10. The terminal 51 of the SAW element 50 formed on the face 80A of the element substrate 80 is electrically connected to one end of the through-hole electrode 12. In this embodiment, to facilitate metallic connection, it is preferable to conduct surface treatment of gold and the like or to provide solder material on the surfaces of the terminal 51 and the one end of the through-hole electrode 12. Alternatively, it is also acceptable to connect the one end of the through-hole electrode 12 and the terminal 51 by pressure welding that utilizes the contraction of the adhesive layer 30. The semiconductor chip 10 and sealing member 40 are joined via the adhesive layer 30. The element substrate 80 having the SAW element 50 is disposed in the interior space 60 surrounded by the semiconductor chip 10, the adhesive layer 30, and the sealing member 40.

Fourth Embodiment

Next, as the fourth embodiment of this invention, electronic equipment provided with any of the electronic components 100 to 300 of the foregoing first to third embodiments is described.

Figure 19:
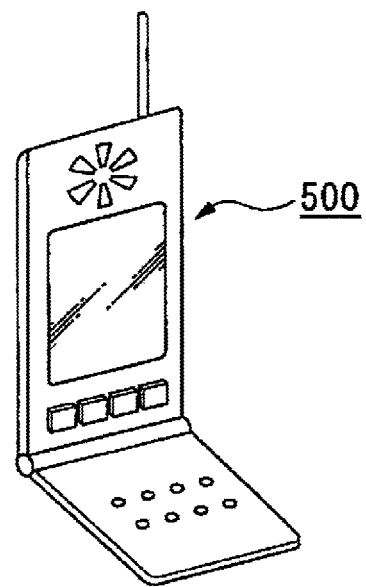
FIG. 19 is a perspective view of an electronic equipment of a fourth embodiment.

FIG. 19 is a view of one example of electronic equipment of the fourth embodiment, and is a view of a cell phone 500. As the cell phone 500 which is the electronic equipment of the fourth embodiment is provided with any of the electronic components 100 to 300 of the foregoing first to third embodiments, it has excellent reliability.

The foregoing has provided a description of suitable embodiments of the manufacturing method for electronic component, electronic component and electronic equipment pertaining to this invention with reference to attached drawings, but this invention is not limited to the aforementioned embodiments. The various forms and combinations of the respective constituent members shown in the above-described embodiments are examples, and a variety of modifications are possible based on design requirements and the like that fall within a scope that does not deviate from the intent of this invention. Moreover, it is also acceptable to form the sealing film 2 so as to cover the electronic component 100 on top of the substrate P. If this is done, it becomes possible to more reliably prevent the infiltration of gas from the outside into the space K between the electronic component 100 and the substrate P.

In the foregoing first to third embodiments, the SAW element 50 was used as the functional element of this invention. This invention is not limited thereto, and it is also acceptable to use, for example, a quartz oscillator, piezoelectric oscillator, piezoelectric tuning fork or the like as the functional element of this invention.

For example, it is possible to prevent malfunctions of the SAW element 50 due to light irradiation by adopting antiglare material as the material of the sealing film 2 in the electronic component of the foregoing embodiments.

Moreover, for example, it is acceptable to form the sealing film 2 in the electronic components of the foregoing embodiments as a multi-layer film formed from different materials.

What is claimed is:

1. An electronic device comprising:
a first substrate;
a second substrate that is a semiconductor substrate, the second substrate having a first surface and a second surface, the first surface facing the first substrate, and the second surface being on a side of the second substrate that is opposite the first surface;
an integrated circuit formed on the second surface of the second substrate;
an oscillator disposed on the first surface of the second substrate between the first substrate and the second substrate, the oscillator being spaced apart from the first substrate;
a sealing layer being a monolithic structure and covering the first substrate and a fringe of the second substrate; and
a through-hole electrode which penetrates the second substrate and connects the oscillator and the integrated circuit.

2. The electronic device according to claim 1, wherein the first substrate is a glass substrate.

3. An electronic equipment comprising the electronic device according to claim 2.

4. An electronic equipment comprising the electronic device according to claim 1.

5. The electronic device according to claim 1, wherein the sealing layer is an inorganic film.

6. The electronic device according to claim 1, wherein the sealing layer directly contacts the entire first major surface of the first substrate that is opposite to the second major surface of the first substrate that faces the second substrate.

7. The electronic device according to claim 1, further comprising a connection terminal provided on the second surface of the second major substrate.

8. An electronic device comprising:
a first substrate having a first major surface and a second major surface;
a second substrate that is a semiconductor substrate, the second substrate having a first major surface and a second major surface, and the first major surface of the second substrate facing the second major surface of the first substrate;
an integrated circuit formed on the second major surface of the second substrate;
an oscillator disposed on the first major surface of the second substrate between the first substrate and the second substrate, the oscillator being spaced apart from the second major surface of the first substrate;
a sealing layer being a monolithic structure and directly contacting the first major surface of the first substrate and a fringe of the first major surface of the second substrate, and
a through-hole electrode which penetrates the second substrate and connects the oscillator and the integrated circuit.

9. The electronic device according to claim 8, wherein the first substrate is a glass substrate.

10. An electronic equipment comprising the electronic device according to claim 9.

11. An electronic equipment comprising the electronic device according to claim 8.

12. The electronic device according to claim 8, wherein the sealing layer is an inorganic film.

13. The electronic device according to claim 8, further comprising a connection terminal provided on the second major surface of the second substrate.

* * * * *